(12) United States Patent
Katayama

(10) Patent No.: US 7,949,485 B2
(45) Date of Patent: May 24, 2011

(54) PORTABLE TERMINAL DEVICE

(75) Inventor: Hiroshi Katayama, Kanagawa (JP)

(73) Assignee: Panasonic Corporation, Osaka (JP)

( * ) Notice: Subject to any disclaimer, the term of this patent is extended or adjusted under 35 U.S.C. 154(b) by 956 days.

(21) Appl. No.: 11/814,842

(22) PCT Filed: Jan. 25, 2006

(86) PCT No.: PCT/JP2006/301148
§ 371 (c)(1),
(2), (4) Date: Jul. 26, 2007

(87) PCT Pub. No.: WO2006/080354
PCT Pub. Date: Aug. 3, 2006

(65) Prior Publication Data
US 2009/0319222 A1    Dec. 24, 2009

(30) Foreign Application Priority Data
Jan. 27, 2005  (JP) .................... 2005-019929

(51) Int. Cl.
*G01C 17/38* (2006.01)
(52) U.S. Cl. ........................................... 702/92
(58) Field of Classification Search .................. 702/92, 702/150
See application file for complete search history.

(56) References Cited

U.S. PATENT DOCUMENTS

| 6,536,123 | B2 | 3/2003 | Tamura |
| 7,210,236 | B2 | 5/2007 | Sato et al. |
| 7,818,136 | B2 * | 10/2010 | Chen et al. ............ 702/92 |
| 2003/0134665 | A1 | 7/2003 | Kato et al. |
| 2005/0126023 | A1 * | 6/2005 | Kwon et al. ............ 33/356 |
| 2005/0143148 | A1 | 6/2005 | Sato et al. |
| 2005/0283988 | A1 * | 12/2005 | Sato et al. ............ 33/356 |
| 2008/0051987 | A1 | 2/2008 | Okeya |

FOREIGN PATENT DOCUMENTS

| EP | 1 843 554 | * 10/2007 |
| JP | 2001-204062 | 7/2001 |
| JP | 2002-196055 A | 7/2002 |
| JP | 2003-005629 A | 1/2003 |
| JP | 2004-012416 A | 1/2004 |
| JP | 2004-064302 | 2/2004 |
| JP | 20044246765 A | 9/2004 |
| JP | 2005291934 A | 10/2005 |
| JP | 2006-023293 A | 1/2006 |

OTHER PUBLICATIONS

Japanese International Search Report; Mar. 14, 2006.

* cited by examiner

*Primary Examiner* — Michael P Nghiem
(74) *Attorney, Agent, or Firm* — Pearne & Gordon LLP

(57) ABSTRACT

A portable terminal device 101 of the invention having at least two or more cases joinable in a plurality of different joining shapes includes a magnetism detection section 8 being provided in at least one of the two or more cases for detecting a magnetism quantity; a storage section 9 for storing the effect amount produced by magnetism from a magnetism generation source of the portable terminal device 101 in the detected magnetism quantities for each of the plurality of different joining shapes of the portable terminal device 101; a case shape detection section 4 for detecting a joining shape of the portable terminal device 101; a data processing section 3 for correcting the detected magnetism quantity based on the stored effect amount in the detected joining shape; and a position measurement section 2 for measuring an azimuth based on the corrected magnetism quantity.

2 Claims, 7 Drawing Sheets

FIG. 2
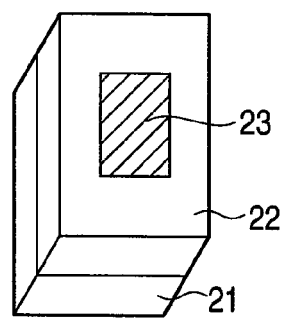
(a)
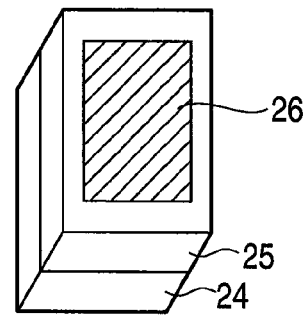
(b)
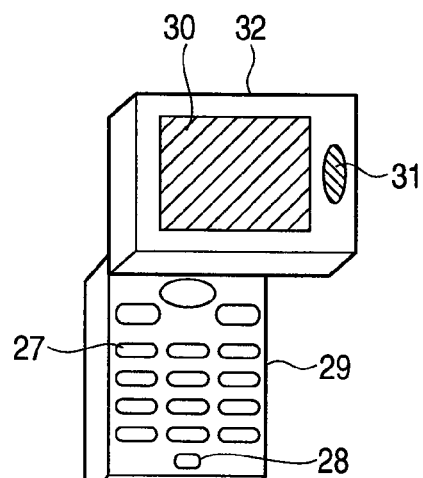
(c)
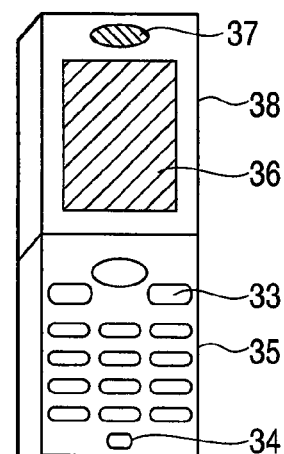
(d)
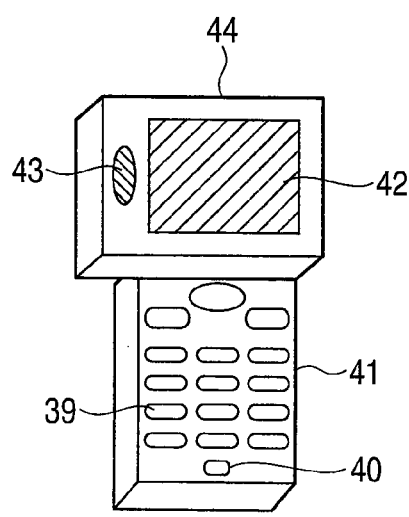
(e)
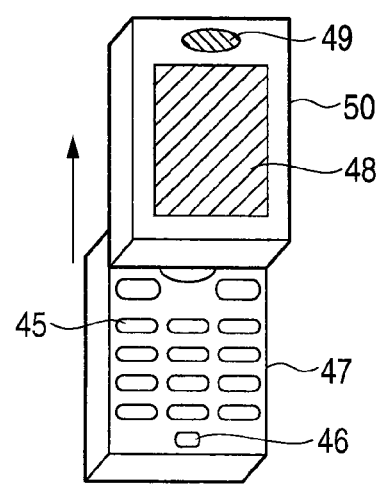
(f)

PORTABLE TERMINAL DEVICE

TECHNICAL FIELD

This invention relates to a portable terminal device having a function of routing assistance of a human being, an automobile, etc., using a position measurement system.

BACKGROUND ART

In recent years, a pedestrian navigation system using GPS (global positioning system) has been developed. This pedestrian navigation system searches for a route to the destination based on the current position of the pedestrian and map information and displays the found route on a display section (for example, refer to patent document 1). Nowadays, a portable terminal device such as a portable telephone or a PDA installing the navigation system is provided for making it possible to give routing assistance to a pedestrian while conducting telephone conversation or communications.

By the way, a portable telephone provided with a display section such as a liquid crystal display and a key operation section on separate cases so that the terminal cases can be folded with one shaft as the center is provided. In the foldable portable telephone, a microphone and a loudspeaker as magnetism generation sections are provided on separate cases and a magnetism detection section is provided on either of the terminal cases.
Patent document 1: JP-A-2001-204062

DISCLOSURE OF THE INVENTION

Problems to be Solved by the Invention

However, when the portable telephone is folded and is opened, the position and the orientation of the magnetism generation section relative to the magnetism detection section are changed, the magnitude of a magnetic field produced by the magnetism generation section relative to the magnetism detection section is changed, as a result, a position measurement value of the GPS becomes inaccurate.

The invention is embodied for solving the problems in the related art as described above and it is an object of the invention to provide a portable terminal device capable of always providing a precise azimuth if the distance or the direction from a magnetism generation section of a loudspeaker, etc., to a magnetism detector changes as cases are opened/closed or are rotated.

Means for Solving the Problems

A portable terminal device of the invention is a portable terminal device in which at least two cases can be joined with a plurality of shapes different in relative apart state, and includes a magnetism detection section which is provided in at least one of the plurality of cases and detects a magnetism quantity; a storage section which stores an effect amount produced by magnetism from a magnetism generation source of the portable terminal device in the magnetism quantity detected by the magnetism detection section for each of a plurality of joint shapes of the portable terminal device; a case shape detection section which detects the joint shape of the portable terminal device; a data processing section which corrects the magnetism quantity detected by the magnetism detection section based on the effect amount stored in the storage section in the joint shape detected by the case shape detection section; and a measurement section which measures an azimuth based on the magnetism quantity corrected by the data processing section.

According to the configuration, the effect of magnetism produced from various electronic machines and electronic circuits contained in the portable terminal device on the magnetism quantity detected by the magnetism detection section (magnetic sensor) is previously stored as geomagnetism correction data for each joint state of a plurality of cases included in the portable terminal device and when the geomagnetism quantity is calculated, the geomagnetism correction data is referenced and the magnetism quantity detected by the magnetism detection section is corrected, whereby the geomagnetism quantity can be precisely measured for each joint state of a plurality of cases and consequently the azimuth in which the portable terminal device is oriented can be measured precisely.

Also, in the portable terminal device of the invention, the data processing section stores the effect amount calculated based on the magnetism quantity detected by the magnetism detection section in the storage section in association with the joint shape of the portable terminal device detected by the case shape detection section when the portable terminal device rotates in a horizontal direction.

According to the configuration, if there are various joint shapes in various portable terminal devices, the effect of magnetism produced from various electronic machines and electronic circuits contained in the portable terminal device on the magnetism quantity detected by the magnetism detection section can be registered as geomagnetism correction data for each of the joint shapes, and the geomagnetism quantity can be precisely measured for each of various joint shapes.

Advantages of the Invention

According to the portable terminal device of the invention, a precise azimuth can always be provided if the distance or the direction from the magnetism generation section of a loudspeaker, etc., to the magnetism detector changes as the terminal cases are opened/closed or are rotated.

BRIEF DESCRIPTION OF THE DRAWINGS

FIG. 2 is a schematic representation to show case shape examples of the portable terminal device of the invention.

DESCRIPTION OF REFERENCE NUMERALS

Figure 1:
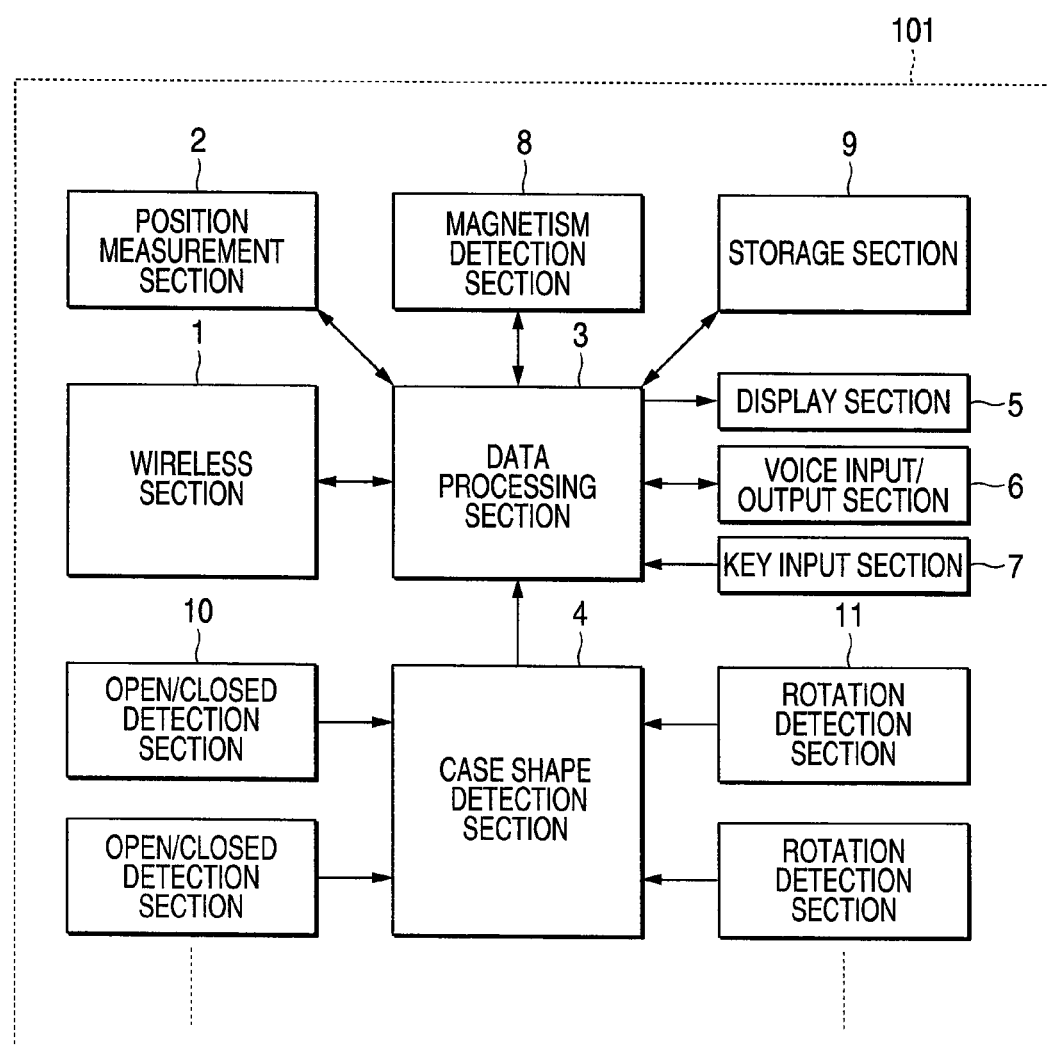
FIG. 1 is a block diagram to show a portable terminal device according to an embodiment of the invention.

3 Data processing section
4 Case shape detection section

8 Magnetism detection section
9 Storage section
21, 22, 24, 25, 29, 32, 35, 38, 41, 44, 47, 50 Terminal case
28, 34, 40, 46 Microphone
31, 37, 43, 49 Loudspeaker
101 Portable terminal device

BEST MODE FOR CARRYING OUT THE INVENTION

A portable terminal device of an embodiment of the invention will be discussed with the accompanying drawings.

FIG. 1 shows the portable terminal device of the embodiment of the invention.

In FIG. 1, a portable terminal device 101 has a wireless section 1, a position measurement section 2, a data processing section 3, a case shape detection section 4, a display section 5, a voice input/output section 6, a key input section 7, a magnetism detection section 8, a storage section 9, open/closed detection sections 10 of terminal cases, and rotation detection sections 11 of terminal cases.

The wireless section 1 transmits and receives various pieces of information of audio, voice, an image, etc., to and from an external wireless terminal in a wireless manner The position measurement section 2 measures the position of the portable terminal device 101 according a method of using the radio wave propagation time difference between each of base stations of portable telephones of the GPS, OTDOA (Observed Time Difference Of Arrival), EOTD (Enhanced Observed Time Difference), etc., and the terminal.

The data processing section 3 controls the whole operation of the portable terminal device 101 and is implemented mainly as a processor operating according to a predetermined program. In the invention, particularly the data processing section 3 calculates a difference from geomagnetism information for each selected different case shape based on geomagnetism information corresponding to a predetermined case shape detected by the case shape detection section 4 and previously stores the difference in a geomagnetism correction data table of the storage section 9 as geomagnetism correction data. The data processing section 3 can correct magnetism information for each case shape detected by the magnetism detection section 8 by referencing the geomagnetism correction data table.

The case shape detection section 4 detects the shapes of a plurality of (in the embodiment, two) terminal cases joined so that the whole shape can be changed, and detects the shape of the terminal case based on open/closed information obtained from either of the open/closed detection sections 10 and rotation information obtained from either of the rotation detection sections 11.

The terminal case shapes are as shown in FIGS. 2(a) to 2(f), for example. In FIG. 2(a), a terminal case 22 having a display section (not shown) and a terminal case 21 having a key section (not shown) are joined so that they can be opened and closed with one shaft; when they are closed, a sub liquid crystal display section 23 faces the outside.

In FIG. 2(b), a terminal case 24 and a terminal case 25 are joined so that the terminal cases can be opened and closed and can be rotated with two shafts; when the terminal cases are closed, a main liquid crystal display section 26 faces the outside.

In FIG. 2(c), a terminal case 29 having a key section 27 and a voice input section (microphone) 28 and a terminal case 32 having a main liquid crystal display section 30 and a voice output section (loudspeaker) 31 are joined so that the terminal cases can be opened and closed with one shaft. In FIG. 2(c), further, in a state in which the terminal case 32 is opened, it can be rotated 90 degrees within the same plane with another shaft as the center.

FIG. 2(d) shows the portable terminal device 101 such as a general open/closed type portable telephone; a terminal case 35 having a key section 33 and a voice input section 34 and a terminal case 38 having a main liquid crystal display section 36 and a voice output section 37 are joined so that the terminal cases can be opened and closed with one shaft.

Further, in FIG. 2(e), a terminal case 44 having a main liquid crystal display section 42 and a voice output section 43 can be opened and closed with one shaft relative to a terminal case 41 having a key section 39 and a voice input section 40, and in the open state, the terminal case 44 can be rotated 90 degrees in an opposite direction to that shown in FIG. 2(c).

In FIG. 2(f), a terminal case 50 having a main liquid crystal display section 48 and a voice output section 49 is slid relative to a terminal case 47 having a key section 45 and a voice input section 46 as the terminal cases can be opened and closed with one shaft. The open/closed state and the rotation state of the terminal cases is detected by the open/closed detection section 10 and the rotation detection section 11 and is input to the case shape detection section 4. The case shape detection section 4 detects the case shape (form) changing as the case is open/closed or is rotated, and outputs the case shape to the data processing section 3.

In FIG. 1, the display section 5 corresponds to the main liquid crystal display section 23, 26, 30, 36, 42, 48 in FIG. 2, and the voice input/output section 6 corresponds to the voice input section 28, 34, 40, 46 and the voice output section 31, 37, 43, 49 in FIG. 2. The key input section 7 in FIG. 1 corresponds to the key section 27, 33, 39, 45 in FIG. 2.

Figure 3:
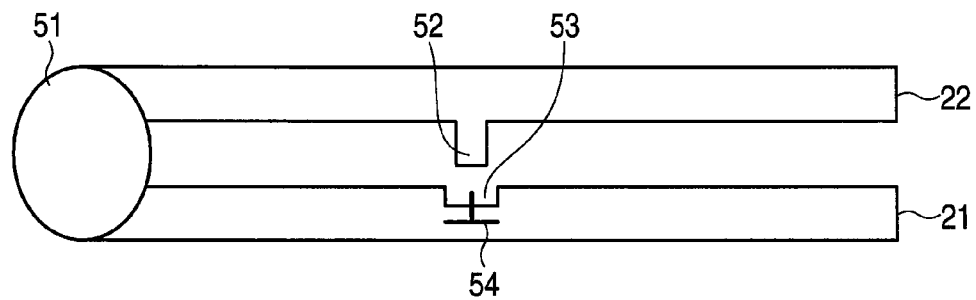
FIG. 3 is a conceptual drawing to show an open/closed detection mechanism of terminal cases in the invention.

FIG. 3 illustrates an open/closed detection section of the two terminal cases 21 and 22, for example, in FIG. 2(a). In the open/closed detection section, the terminal case 22 opened and closed with a hinge part 51 as the center is formed with a convex part 52 and the terminal case 21 is formed with a concave part 53 into which the convex part 52 is fitted. The relationship between the convex part 52 and the concave part 53 may be opposite.

The concave part 53 is provided with a switch element 54. In the open/closed detection section, when the terminal cases 21 and 22 are closed, the convex part 52 causes the switch element 54 in the concave part 53 to operate; on the other hand, when the terminal cases are opened, the operation of the switch element 54 is released. As the switch element 54 is operated and the operation of the switch element 54 is released, the open state and the closed state of the terminal cases 21 and 22 can be detected.

Figure 4:
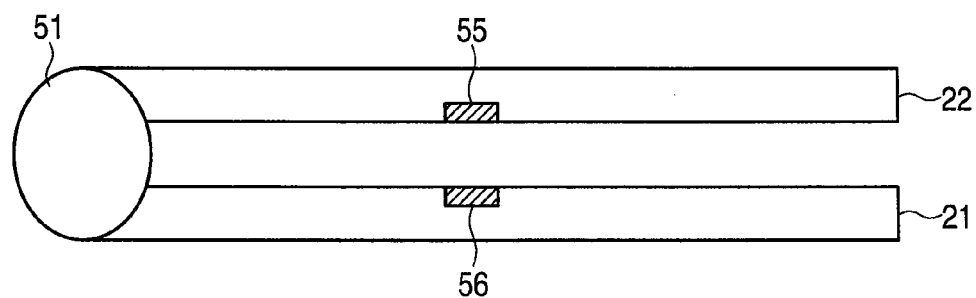
FIG. 4 is a conceptual drawing to show another open/closed detection mechanism of terminal cases in the invention.

FIG. 4 shows that the terminal case 22 is provided with a magnet 55 and the terminal case 21 is provided with a magnetism detection section 56 such as a hall device in the part corresponding to the magnet 55 as an open/closed detection mechanism. In the open/closed detection mechanism, when the terminal cases 21 and 22 are closed, the magnetism detection section 56 outputs a detection signal upon reception of magnetism of the magnet 55; on the other hand, when the terminal cases are opened, the magnetism detection section 56 stops outputting the detection signal. The open state and the closed state of the terminal cases 21 and 22 can be detected according to whether or not the detection signal is output. The positions of the magnet 55 and the magnetism detection section 56 may be opposite.

Such an open/closed detection section can also be applied to the terminal cases 24 and 25, the terminal cases 29 and 32, the terminal cases 35 and 38, the terminal cases 41 and 44, and the terminal cases 47 and 50. Although not shown, mechanical or magnetic detection units similar to that described above is also adopted for the rotation detection section, whereby rotation detection of the terminal cases can be easily accomplished.

Figure 5:
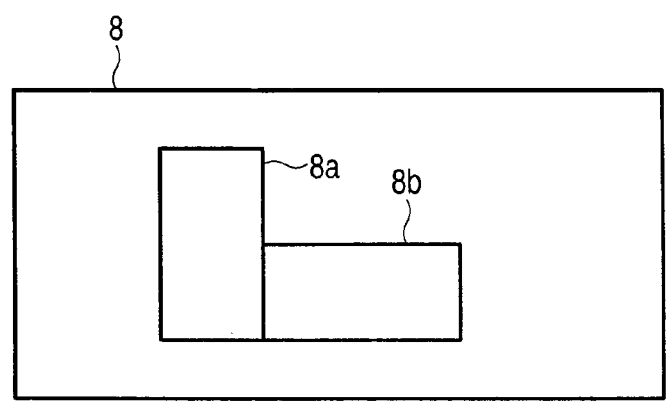
FIG. 5 is a schematic representation to show a placement example of azimuth detection elements forming a part of the invention.
Figure 6:
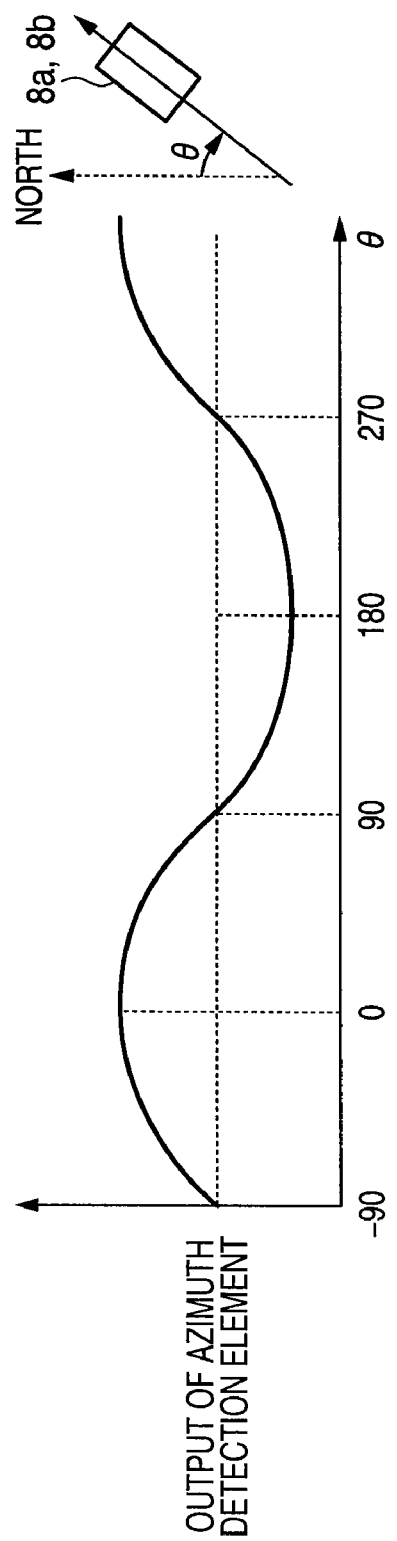
FIG. 6 is an output characteristic drawing of magnetism detection section in the invention.
Figure 7:
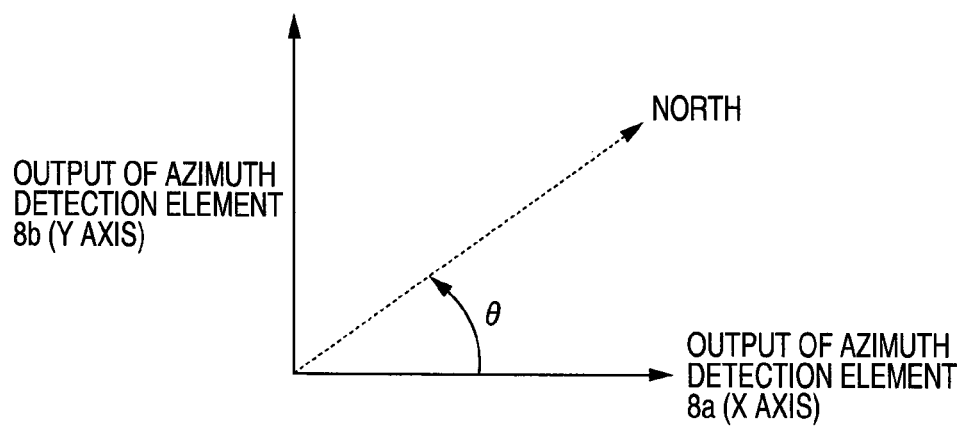
FIG. 7 is an output characteristic drawing of the azimuth detection elements in the invention.

The portable terminal device with the terminal cases opened and closed or rotated with one shaft or two or more shafts has one or more offset values while the number of offset values of magnetism detection section 8 in the terminal case not adopting an open/closed or rotation structure is one. Assuming that the magnetism detection section 8 attached to a portable telephone has two azimuth detection elements 8a and 8b placed at the right angle within the same plane as shown in FIG. 5, if the output values are measured about all azimuths, they become like a sinusoidal form as shown in FIG. 6. However, the phases of outputs of X and Y axes differ (generally a shift of 90 degrees). At this time, letting the outputs of the azimuth detection elements 8a and 8b be Hx and Hy, azimuth angle θ=arc tan (Hy/Hx), and the azimuth angle θ and the azimuth output values can be represented on X, Y coordinates as shown in FIG. 7.

Next, the operation of the portable terminal device 101 shown in FIG. 1 is as follows:

To begin with, to use the portable terminal device 101 for man navigation for a pedestrian, geomagnetism offset information is set in the geomagnetism correction data table of the storage section 9 as geomagnetism correction data. The geomagnetism correction data corrects the effect of a magnetic field of the magnetism generation section of the loudspeaker, the microphone, etc., of the terminal case as the two terminal cases are opened/closed or are rotated on the magnetism detection section 8.

Figure 8:
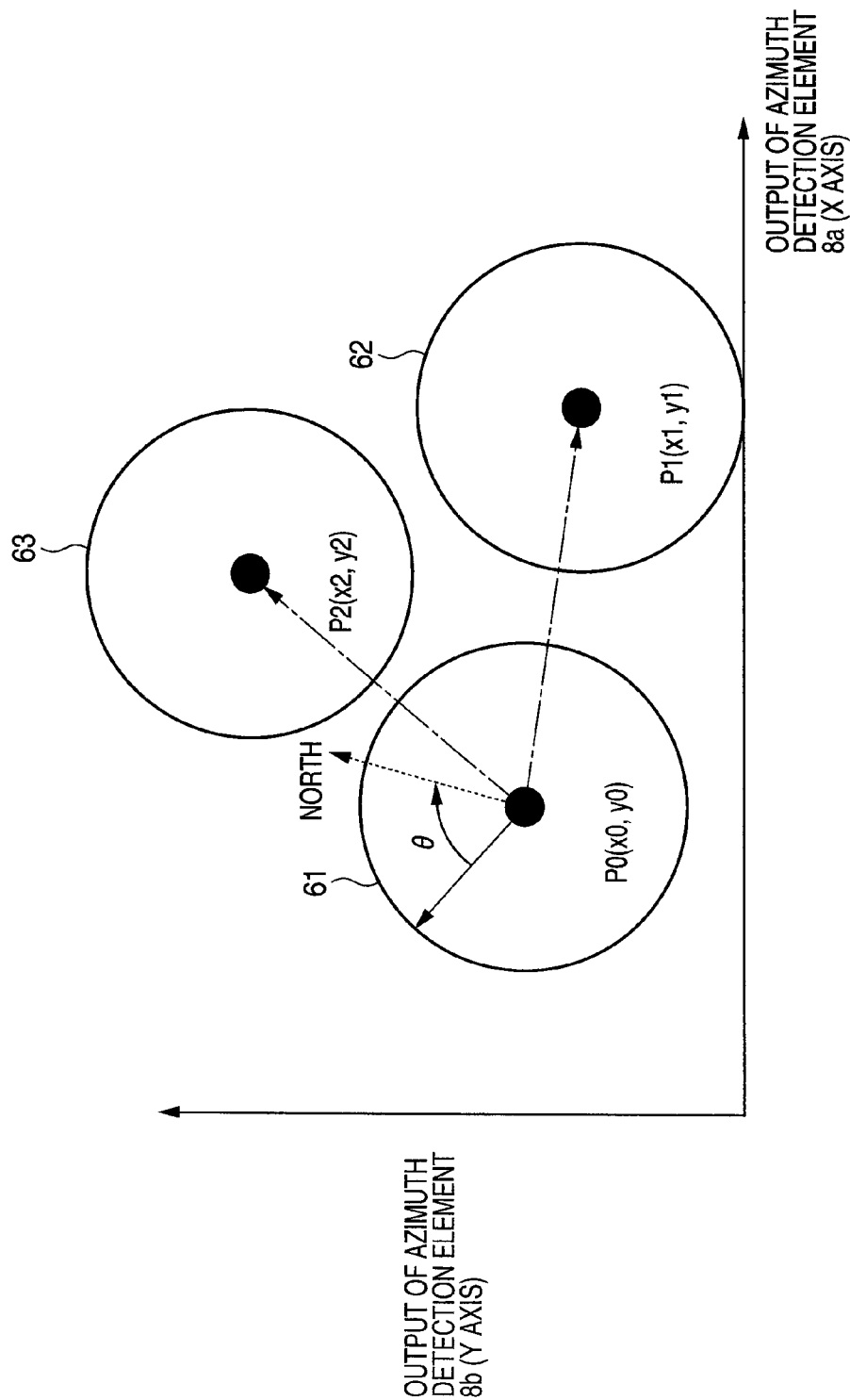
FIG. 8 is a schematic representation to show azimuth detection output characteristic in correspondence with case shapes in the portable terminal device of the invention.
Figure 9:
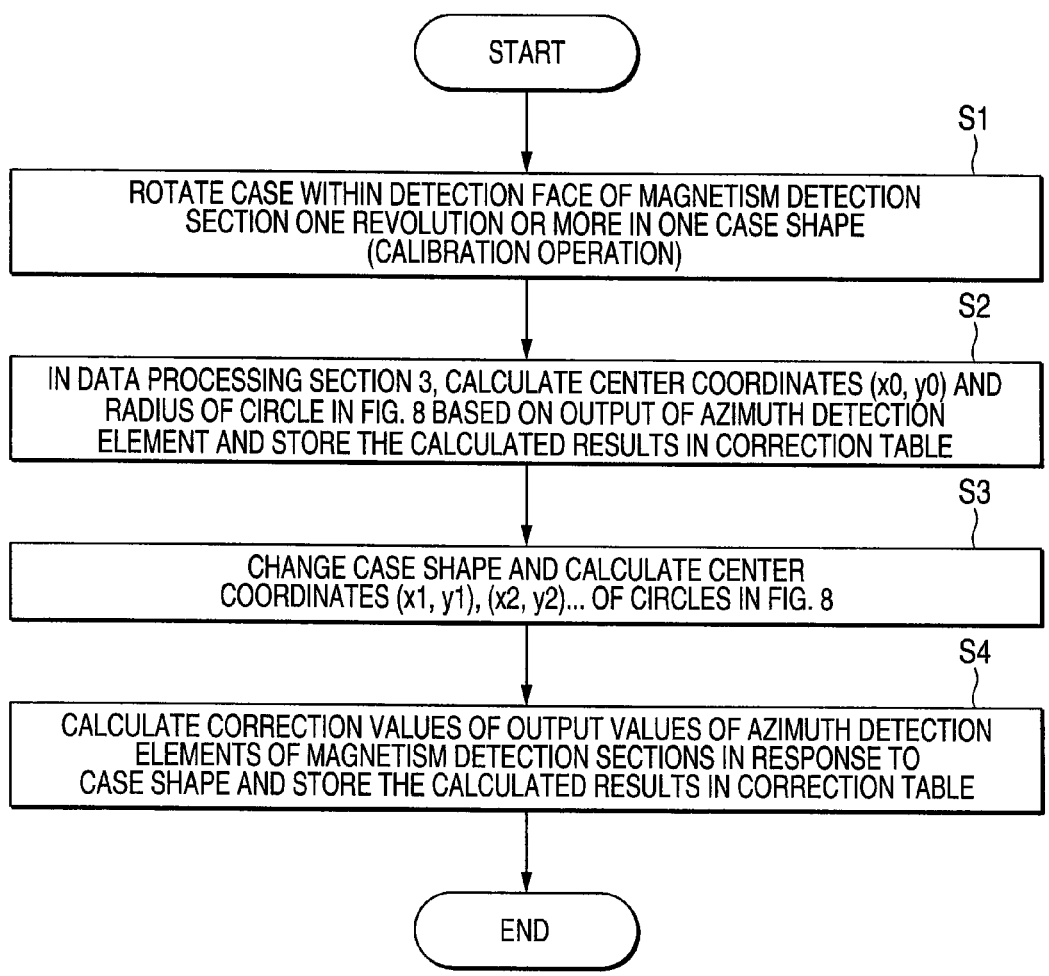
FIG. 9 is a flowchart to show a setting procedure of geomagnetism correction data in the invention.

FIG. 8 is a schematic representation to show the effect of the magnetic field of the magnetism generation section on the magnetism detection section 8, and FIG. 9 is a flowchart to show a setting procedure of the geomagnetism correction data to remove the effect. FIG. 8 shows the effect of giving a magnetic field different from geomagnetism by the loudspeaker or the microphone on the magnetism detection section 8 when the case shape changes from FIG. 2(d) to FIG. 2(a) or FIG. 2(b), for example, as the two terminal cases are opened/closed or are rotated.

That is, as the terminal cases are opened/closed or are rotated, the output level of the magnetism detection section 8 drifts and, for example, the center coordinates of the outputs of the azimuth detection elements 8a and 8b on XY coordinates shift from P0 (x0, y0) in FIG. 2(d) to P1 (x1, y1) in FIG. 2(a) or P2 (x2, y2) in FIG. 2(b). In FIG. 8, circles 61, 62, and 63 are loci drawn based on the effect of geomagnetism of the earth according to the azimuth in which the portable terminal device 101 should be oriented about the center coordinates P0, P1, and P2.

From the information of the optimum center coordinates P0 (x0, y0) to Pn (xn, yn) corresponding to the case shape thus obtained, the shifts (differences) from the coordinates P1 (x1, y1) to Pn (xn, yn) with the center coordinates P0 (x0, y0) as the center are found. The differences are previously stored in the geomagnetism correction data table 9 at the product shipment time, etc.

When the case shape changes at the actual use time of the portable terminal device 101, the geomagnetism correction data table in the storage section 9 is referenced and the differences are used as geomagnetism correction data.

Accordingly, the shift from other center coordinates P1 (x1, y1), P2 (x2, y2) . . . , namely, the azimuth detection output shift can be corrected with the center coordinates P0 (x0, y0) as the reference and consequently, precise azimuth detection independent of change in the case shape can be made.

Next, the setting procedure of the geomagnetism correction data table in the storage section 9 will be discussed with reference to FIG. 9.

First, in one case shape used as the reference (for example, FIG. 2(d)), the portable terminal device 101, namely, the magnetism detection section 8 is rotated one revolution or more within a flat plane (calibration operation) (step S1).

The data processing section 3 calculates the center coordinates P0 (x0, y0) and the radius of circle, for example, as shown in FIG. 6 from output of the magnetism detection section 8 and stores them in the geomagnetism correction data table (step S2). Accordingly, the reference azimuth for geomagnetism in the case shape in FIG. 2(d) is set.

Subsequently, the case shape is set to each state as the terminal cases are opened/closed or are rotated as shown in FIG. 2(a), (b), (c), (e), (f) and the portable terminal device 101 is rotated within a flat plane in a similar manner to that described above. From each magnetism detection section 8, output corresponding to each azimuth is obtained and the data processing section 3 calculates the center coordinates P2 (x2, y2), P3 (x3, y3) . . . Pn (xn, yn) of circles as shown in FIG. 8 (step S3).

Further, geomagnetism correction data is found from the differences from the azimuth output values in the coordinates P1 (x1, y1), P2 (x2, y2) . . . Pn (xn, yn) corresponding to the case shapes with the azimuth output value in the center coordinate P0 (x0, y0) as the reference, and the correction values are stored in the geomagnetism correction data table in the storage section 9 in correspondence with the coordinates P1 (x1, y1) to Pn (xn, yn) (step S4).

Using the stored geomagnetism correction data, as described above, newly measured (detected) azimuth data is automatically corrected without troubling the user, whereby precise geomagnetism corresponding to each case shape can be measured.

Therefore, in the invention, if the magnetism detection section 8 receives the effect of the magnetic field from the magnetism generation section of the loudspeaker, the microphone, etc., using the geomagnetism correction data corresponding to the case shape detected (measured) by the case shape detection section 4, the effect of geomagnetism in the case shape can be corrected and consequently man navigation, etc., based on correct azimuth detection can be realized.

The user of the portable terminal device 101 rotates the portable terminal device 101 within a flat plane for each case shape as the calibration operation, whereby geomagnetism correction data is found in a similar manner to that described above and can also be stored in the geomagnetism correction data table for use.

Also in this case, using the geomagnetism correction data corresponding to the case shape detected by the case shape detection section 4, the effect of geomagnetism in the case shape can be corrected and consequently man navigation, etc., based on correct azimuth detection can be realized.

INDUSTRIAL APPLICABILITY

The portable terminal device of the invention has the advantage that if the distance or the direction from the magnetism generation section of the loudspeaker, etc., to the magnetism detector changes as the terminal cases are opened/closed or are rotated, a precise azimuth can always be obtained, and is useful in the field of a portable terminal device, etc., having the function of routing assistance of a human being, an automobile, etc., in the precise direction using the position measurement system.

While the invention has been described in detail with reference to the specific embodiments, it will be obvious to those skilled in the art that various changes and modifications can be made without departing from the spirit and the scope of the invention.

This application is based on Japanese Patent Application (No. 2005-019929) filed on Jan. 27, 2005, which is incorporated herein by reference.

The invention claimed is:

1. A portable terminal device in which having at least two cases joinable in a plurality of different joining shapes, the portable terminal device, comprising:
   a magnetism detection section which is provided in at least one of the plurality of cases and detects a magnetism quantity;
   a storage section which stores an effect amount affected by magnetism from a magnetism generation source of the portable terminal device on the detected magnetism quantity for each of the plurality of different joining shapes of the portable terminal device;
   a case shape detection section which detects each of the joining shapes of the portable terminal device;
   a data processing section which corrects the detected magnetism quantity based on the stored effect amount for each of the detected joining shapes; and
   a measurement section which measures an azimuth based on the corrected magnetism quantity.

2. The portable terminal device according to claim 1, wherein the effect amount is calculated based on the magnetism quantity detected by the magnetism detection section and the data processing section stores the calculated effect amount in the storage section together with each of the detected joining shapes of the portable terminal device when the portable terminal device rotates in a horizontal direction.

* * * * *

UNITED STATES PATENT AND TRADEMARK OFFICE
CERTIFICATE OF CORRECTION

PATENT NO. : 7,949,485 B2
APPLICATION NO. : 11/814842
DATED : May 24, 2011
INVENTOR(S) : Hiroshi Katayama It is certified that error appears in the above-identified patent and that said Letters Patent is hereby corrected as shown below:

In column 7, line 10, please delete the words "in which"

Signed and Sealed this
Fifteenth Day of November, 2011

David J. Kappos
*Director of the United States Patent and Trademark Office*